United States Patent
Kang et al.

(10) Patent No.: US 7,183,207 B2
(45) Date of Patent: Feb. 27, 2007

(54) CHEMICAL VAPOR DEPOSITION METALLIZATION PROCESSES AND CHEMICAL VAPOR DEPOSITION APPARATUS USED THEREIN

(75) Inventors: Doo-Won Kang, Gangwon-do (KR); Kap-Soo Lee, Gyeonggi-do (KR); Hyun-Jong Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 59 days.

(21) Appl. No.: 10/855,114

(22) Filed: May 26, 2004

(65) Prior Publication Data
US 2004/0241988 A1 Dec. 2, 2004

(30) Foreign Application Priority Data
May 30, 2003 (KR) .................. 10-2003-0034946

(51) Int. Cl.
*H01L 21/44* (2006.01)
(52) U.S. Cl. .................. 438/680; 438/597; 438/685; 257/E21.17; 257/E29.143
(58) Field of Classification Search ............ 438/597, 438/680, 685, FOR. 408; 257/E21.17, E29.143
See application file for complete search history.

(56) References Cited

U.S. PATENT DOCUMENTS

| | | | |
|---|---|---|---|
| 5,989,623 A | | 11/1999 | Chen et al. |
| 6,110,828 A | * | 8/2000 | Guo et al. .................. 438/688 |
| 6,187,667 B1 | * | 2/2001 | Shan et al. .................. 438/636 |
| 6,200,432 B1 | * | 3/2001 | Kobayashi et al. .... 204/192.12 |
| 6,238,533 B1 | | 5/2001 | Satipunwaycha et al. |
| 6,579,786 B2 | * | 6/2003 | Schmidbauer et al. ...... 438/618 |
| 6,589,887 B1 | * | 7/2003 | Dalton et al. ............... 438/765 |
| 6,905,959 B1 | * | 6/2005 | Ashtiani et al. ............ 438/648 |
| 2002/0013049 A1 | * | 1/2002 | Yang et al. .................. 438/653 |

FOREIGN PATENT DOCUMENTS

| | | |
|---|---|---|
| JP | 2002-058985 | 2/2002 |
| KR | 20020919 | 3/2001 |

OTHER PUBLICATIONS

English language abstract of Japanese Publication No. 2002-058985.
English language abstract of Korean Publication No. 20020919.

* cited by examiner

*Primary Examiner*—Michelle Estrada
(74) *Attorney, Agent, or Firm*—Marger Johnson & McCollom, P.C.

(57) ABSTRACT

CVD metallization processes and CVD apparatus used therein are provided. The processes include forming a barrier metal layer on a semiconductor substrate and cooling the semiconductor substrate having the barrier metal layer without breaking vacuum. An additional metal layer may be formed on the cooled barrier metal layer. The in-situ cooling process is preferably performed inside a cooling chamber installed between first and second transfer chambers, which are separated from each other. The barrier metal layer may be formed inside a CVD process chamber attached to the first transfer chamber, and the additional metal layer may be formed inside another CVD process chamber attached to the second transfer chamber.

34 Claims, 6 Drawing Sheets

CHEMICAL VAPOR DEPOSITION METALLIZATION PROCESSES AND CHEMICAL VAPOR DEPOSITION APPARATUS USED THEREIN

CROSS-REFERENCE TO RELATED APPLICATION

This application claims the benefit of Korean Patent Application No. 2003-34946, filed on May 30, 2003, the contents of which are incorporated herein by reference in their entirety.

BACKGROUND OF THE INVENTION

1. Field of the Invention

The present invention relates to fabrication processes of semiconductor devices and fabrication equipment used therein and, more particularly, to metallization processes and chemical vapor deposition apparatus used therein, and more particularly, to in situ metallization processes and chemical vapor deposition apparatus used therein.

2. Description of the Related Art

Metal lines are necessarily used in fabrication of semiconductor devices. The formation of the metal lines includes forming a metal layer on a semiconductor substrate and patterning the metal layer using photolithography/etch processes. During the photolithography process, an irregular reflection may occur on the surface of the metal layer. The irregular reflection is due to the surface roughness of the metal layer. Accordingly, an anti-reflective coating layer is widely used in order to suppress the irregular reflection.

A method of forming the metal layer and the anti-reflective coating layer is taught in U.S. Pat. No. 6,187,667 B1 to Shan et al., entitled "Method of Forming Metal Layer and/or Antireflective Coating Layer On An Integrated Circuit". According to Shan et al., the metal layer is cooled prior to formation of the anti-reflective coating layer on the metal layer. Thus, it can prevent protrusions such as bumps from being produced on the surface of the metal layer during the formation of the anti-reflective coating layer.

In the event that the metal layer directly contacts an impurity region formed at a predetermined area of a semiconductor substrate through a contact hole that penetrates an interlayer insulating layer, metal atoms in the metal layer may be diffused into the impurity region. In this case, junction leakage current of the impurity region can be increased to cause a malfunction of a semiconductor device. Accordingly, most of highly-integrated semiconductor devices widely employ a barrier metal layer interposed between the metal layer and the impurity region. In general, the barrier metal layer is formed using a chemical vapor deposition (CVD) technique at a high temperature of about 700° C. in order to obtain good step coverage, and the metal layer is formed at a low temperature less than 500° C. Therefore, when the barrier metal layer and the metal layer are sequentially formed using an in-situ process in a single deposition apparatus, the electrical characteristics of the contact resistance between the metal layer and the impurity region may be degraded due to the high temperature of the barrier metal layer.

Further, a metallization process employing a copper layer is taught in U.S. Pat. No. 5,989,623 to Chen et al., entitled "Dual Damascene Metallization". According to Chen et al., there is a deposition system for forming copper lines. However, the deposition system has a configuration that a CVD titanium nitride chamber and a CVD copper chamber are attached to a single transfer chamber. Thus, a source gas used in formation of a CVD titanium nitride layer can be introduced into the CVD copper chamber through the transfer chamber or vice versa. Therefore, the titanium nitride layer or the copper layer may contain impurities.

Furthermore, a technology of filling contact holes is taught in U.S. Pat. No. 6,238,533 to Satipunwaycha et al., entitled "Integrated PVD System For Aluminum Hole Filling Using Ionized Metal Adhesion Layer". According to Satipunwaycha et al., there is provided a deposition system for forming aluminum lines. The deposition system includes two transfer chambers separated from each other and physical vapor deposition (PVD) chambers attached to the transfer chambers. However, the PVD technique exhibits remarkably poor step coverage as compared to a typical CVD technique. Therefore, according to Satipunwaycha et al., there are some limitations in forming a uniform barrier metal layer and metal contact plugs in contact holes having a high aspect ratio.

SUMMARY OF THE INVENTION

In one embodiment, a chemical vapor deposition (CVD) metallization process using a CVD apparatus includes forming a barrier metal layer on a semiconductor substrate, cooling the semiconductor substrate having the barrier metal layer without breaking vacuum, and forming an additional metal layer on the cooled barrier metal layer. As a result, the present invention allows the formation of the reliable contact structure without any degradation of the throughput.

BRIEF DESCRIPTION OF THE DRAWINGS

The exemplary embodiments of the present invention will become more apparent to those of ordinary skill in the art by describing in detail preferred embodiments thereof with reference to the attached drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when it is described that one layer is positioned 'on' another layer or substrate, the layer can be directly formed on another layer or substrate, or the third layer can be positioned between one layer and another layer or substrate. Like numbers refer to like elements throughout the specification.

Figure 1A:
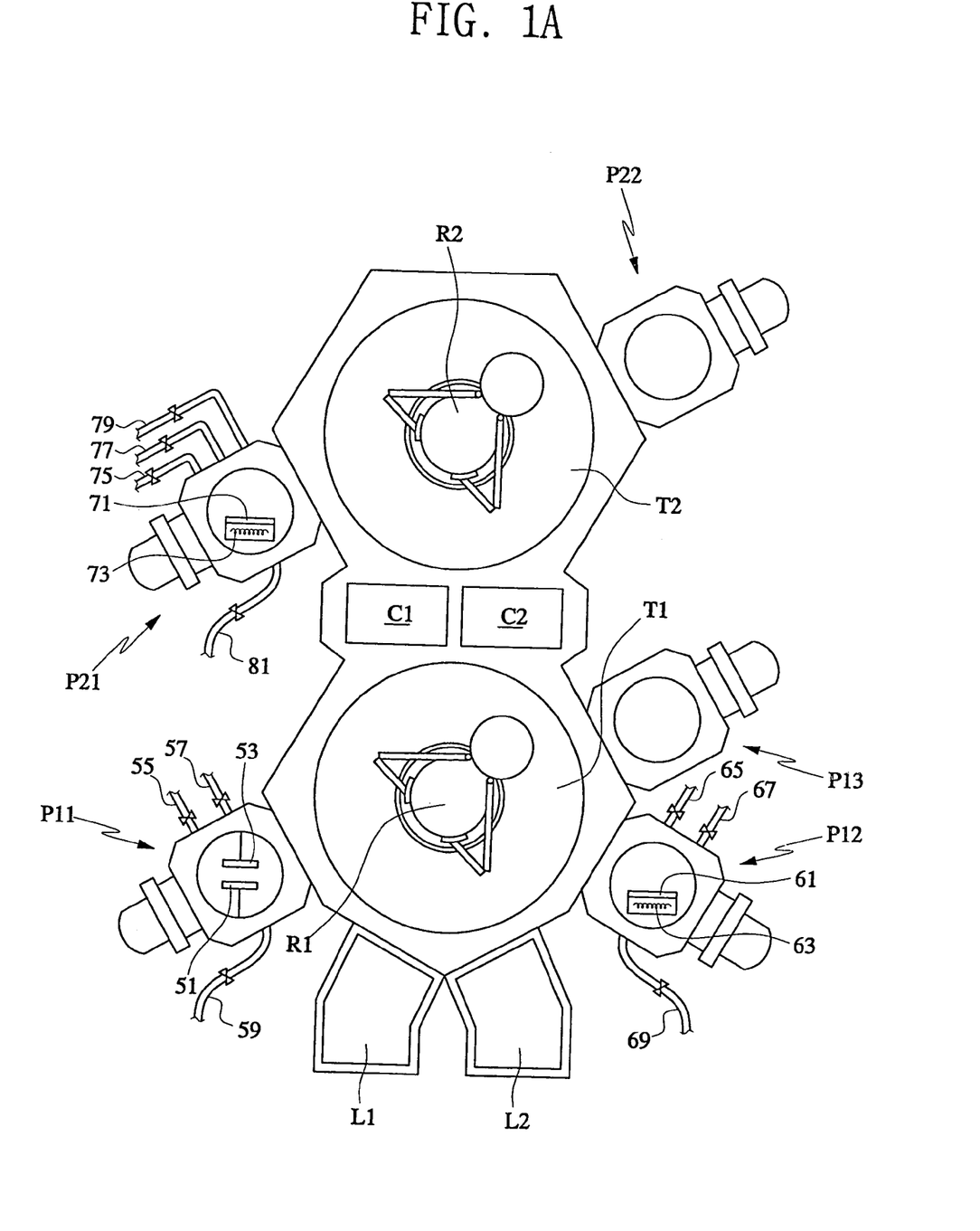
FIG. 1A is a schematic view illustrating CVD apparatus according to an embodiment of the present invention.

Referring to FIG. 1A, at least one cooling chamber is placed between first and second transfer chambers T1 and T2, which are separated from each other. The at least one cooling chamber may include first and second cooling compartments C1 and C2. The first transfer chamber T1 has a first robot R1 installed therein. Similarly, the second transfer chamber T2 has a second robot R2 installed therein.

First and second load lock chambers L1 and L2 are attached to the first transfer chamber T1. The first load lock chamber L1 provides a space for temporarily storing a semiconductor substrate to be loaded into the first transfer chamber T1, and the second load lock chamber L2 provides a space for temporarily storing a semiconductor substrate to be unloaded from the first transfer chamber T1. Thus, the first load lock chamber L1 corresponds to an input load lock chamber, and the second load lock chamber L2 corresponds to an output load lock chamber.

A first group of CVD process chambers P11, P12 and P13, respectively, are attached to the first transfer chamber T1. The first robot R1 transfers a semiconductor substrate stored in the first load lock chamber L1 into any one of the first group of CVD process chambers P11, P12 and P13 and the cooling chambers C1 and C2. Alternatively, the first robot R1 may transfer a semiconductor substrate into any one of the first group of CVD process chambers P11, P12 and P13 and the cooling chambers C1 and C2 and into the second load lock chamber L2.

Any one of the first group of CVD process chambers P11, P12 and P13 may be a plasma CVD chamber. For instance, the first CVD process chamber P11 may be a plasma CVD chamber including a cathode plate 51 and an anode plate 53, which are installed inside the first CVD process chamber P11. The cathode plate 51 is used as a chuck on which a semiconductor substrate is placed, and the anode plate 53 is installed over the cathode plate 51. In this case, the first CVD process chamber P11 includes a plurality of source gas injection conduits 55 and 57. Source gases are injected into the first CVD process chamber P11 through the source gas injection conduits 55 and 57. Also, the first CVD process chamber P11 includes an exhaust line 59. The atmosphere inside the first CVD process chamber P11 is exhausted through the exhaust line 59. The first CVD process chamber P11, can be used to form an ohmic layer, such as a titanium layer.

In the meantime, another chamber of the first group of CVD process chambers P11, P12 and P13 may be a thermal CVD chamber. For example, the second CVD process chamber P12 may be a thermal CVD chamber having a chuck 61 and a heater block 63 installed therein. The heater block 63 is installed below the chuck 61 to heat up a semiconductor substrate placed on the chuck 61. In this case, the second CVD process chamber P12 may also include a plurality of source gas injection conduits 65 and 67 and an exhaust line 69 like the first CVD process chamber P11. The second CVD process chamber P12, can be used to form a barrier metal layer, such as a titanium nitride layer.

The third CVD process chamber P13 may also have the same configuration as the first CVD process chamber P11 or the second CVD process chamber P12 as described above.

A second group of CVD process chambers P21 and P22 are attached to the second transfer chamber T2. In this case, the second robot R2 transfers a semiconductor substrate in the first or second cooling chamber C1 or C2 into one chamber of the second group of CVD process chambers P21 and P22. On the contrary, the second robot R2 may transfer a semiconductor substrate in one chamber of the second group of CVD process chambers P21 and P22 into the first or second cooling chamber C1 or C2.

One of the second group of CVD process chambers P21 and P22 may be a thermal CVD chamber having the same configuration as the second CVD process chamber P12. The fourth CVD process chamber P21 can include a chuck 71 and a heater block 73 installed therein as well as a plurality of source gas injection conduits 75, 77 and 79 and an exhaust line 81. The fourth CVD process chamber, can be used to form a metal layer, such as a tungsten layer. The fifth CVD process chamber P22 may also have the same configuration as the aforementioned plasma CVD chamber or the thermal CVD chamber.

Figure 1B:
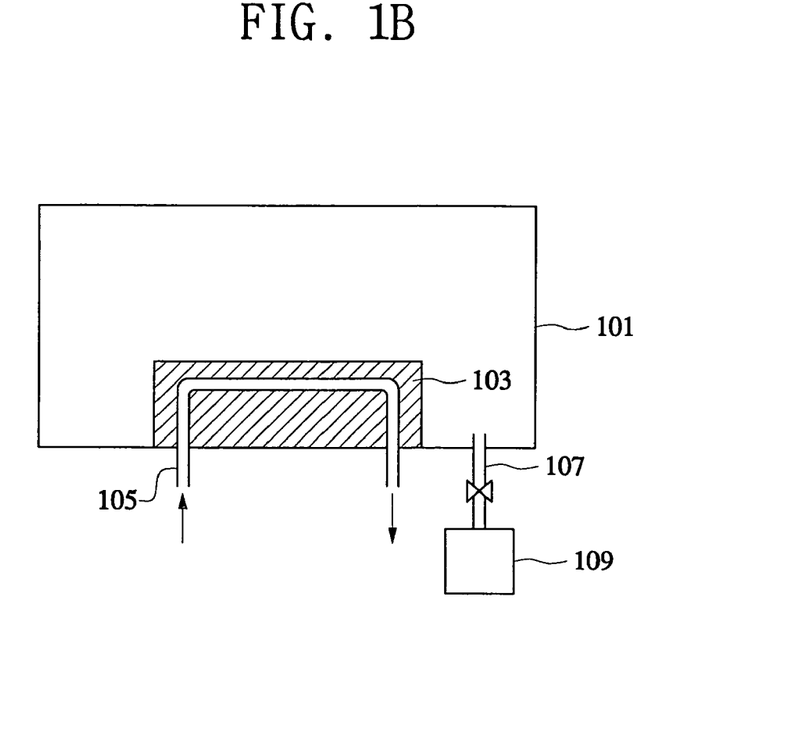
FIG. 1B is an enlarged view illustrating one example of a cooling chamber shown in FIG. 1A.

Referring to FIG. 1B, a stage 103 is installed in a sealed space that is defined by a chamber wall 101. A semiconductor substrate (not shown) is placed on the stage 103. A circulation conduit 105, which functions as a circulation path of a cooling medium, is installed inside the stage 103. De-ionized water (DIW), helium gas or the like may be used as the cooling medium. When the cooling medium flows through the circulation conduit 105, the semiconductor substrate on the stage 103 is cooled. An exhaust line 107 is installed to exit through a portion of the chamber wall 101. The exhaust line 107 is connected to an exhaust pump 109. Thus, the atmosphere inside the chamber wall 101 can be exhausted through the exhaust line 107.

Figure 1C:
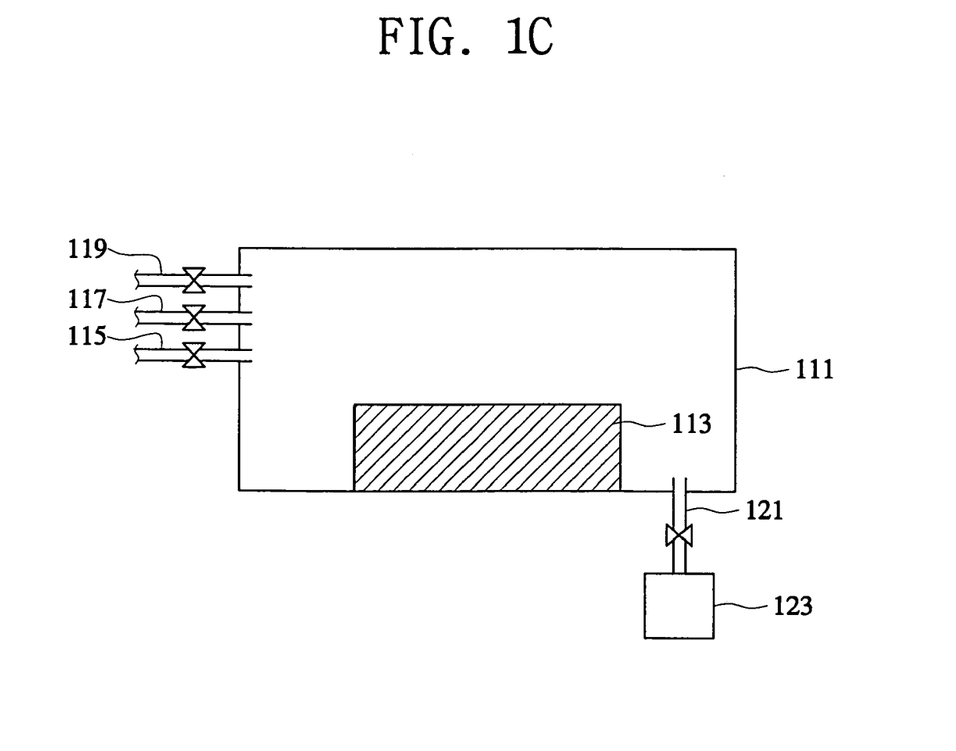
FIG. 1C is an enlarged view illustrating another example of a cooling chamber shown in FIG. 1A.

Referring to FIG. 1C, a chuck 113 is installed inside a sealed space that is defined by a chamber wall 111. At least one cooling gas injection line is installed at the chamber wall 111. For example, first to third cooling gas injection lines 115, 117 and 119 may be installed in the chamber wall 111. A cooling gas is injected into the chamber through at least one of the cooling gas injection lines 115, 117 and 119, respectively, and the cooling gas cools the semiconductor substrate loaded on the chuck 113. In detail, the first to third cooling gas injection lines 115, 117 and 119 can be used as lines for supplying argon gas, nitrogen gas, and helium gas, respectively. In addition, an exhaust line 121 is installed in a portion of the chamber wall 111, and the exhaust line 121 is connected to an exhaust pump 123. Thus, the atmosphere in the chamber can be exhausted out through the exhaust line 121.

Figure 3:
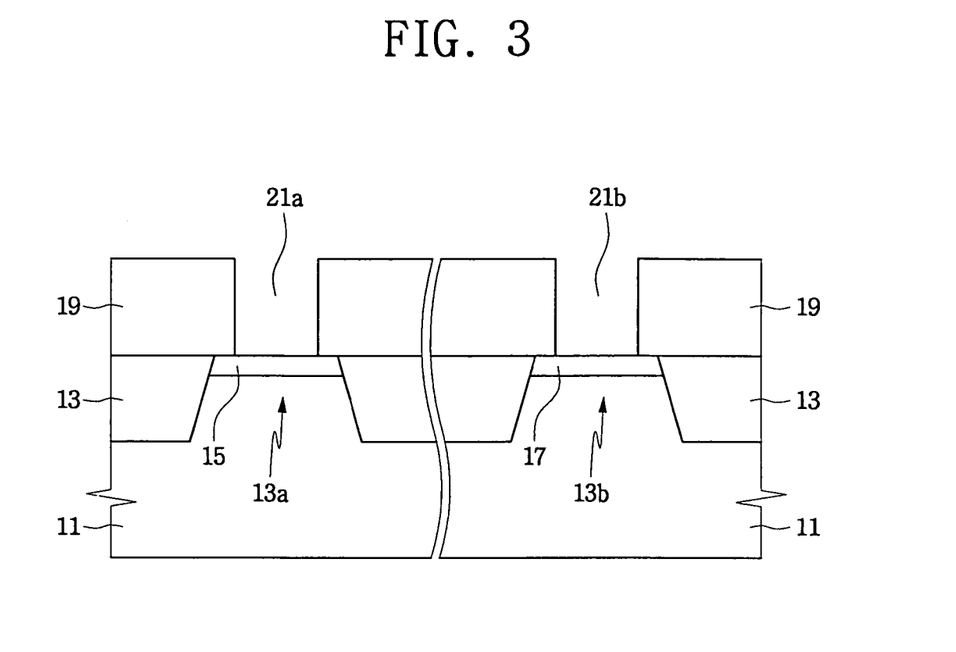
FIGS. 3 to 6 are sectional views to illustrate methods of forming metal layers using the CVD apparatus shown in FIG. 1.

Referring to FIG. 3, a device isolation layer 13 is formed at a semiconductor substrate 11 to define first and second active regions 13a and 13b, which are spaced apart from each other. An N-type impurity region 15 and a P-type impurity region 17 are respectively formed at the first and second active regions 13a and 13b using an ion implantation process and an annealing process well known in the art. An interlayer insulating layer 19 is formed on the semiconductor substrate having the impurity regions 15 and 17. The interlayer insulating layer 19 is patterned to form a first contact hole 21a exposing the N-type impurity region 15 and a second contact hole 21b exposing the P-type impurity region 17.

Figure 2:
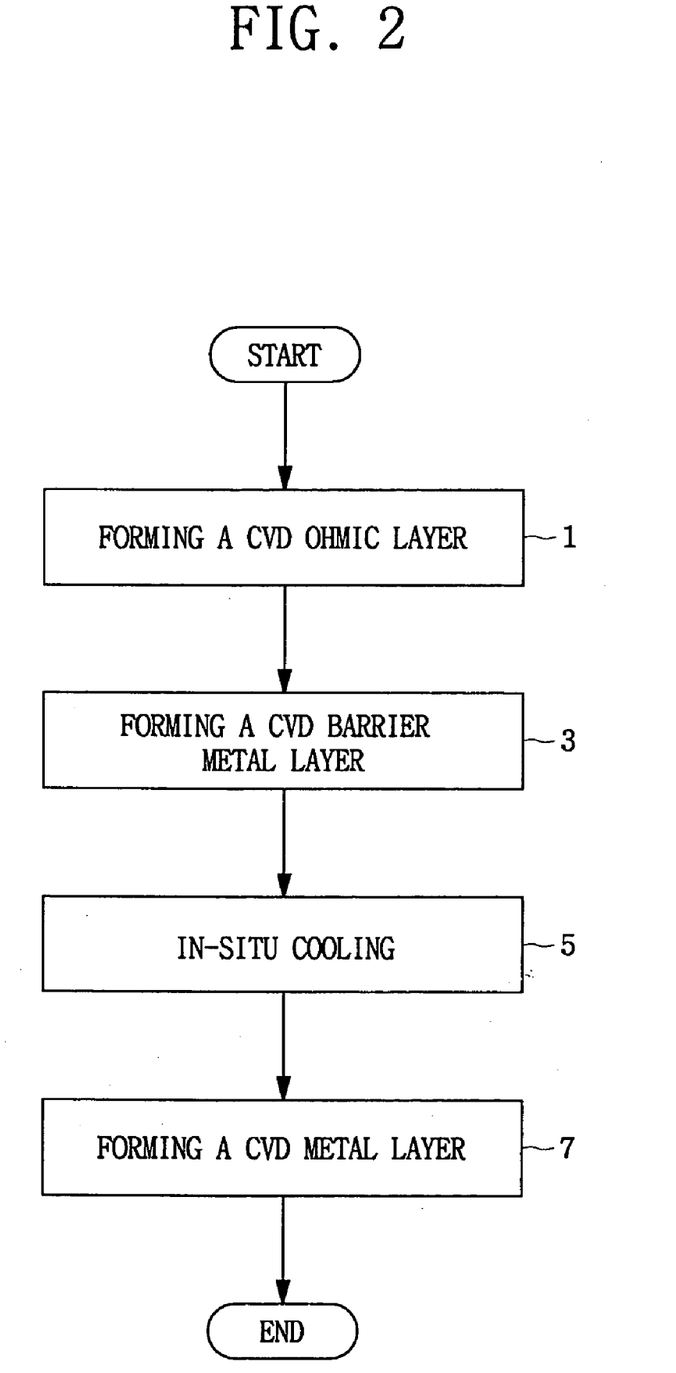
FIG. 2 is a process flow chart to illustrate methods of forming metal layers using the CVD apparatus shown in FIG. 1.
Figure 4:
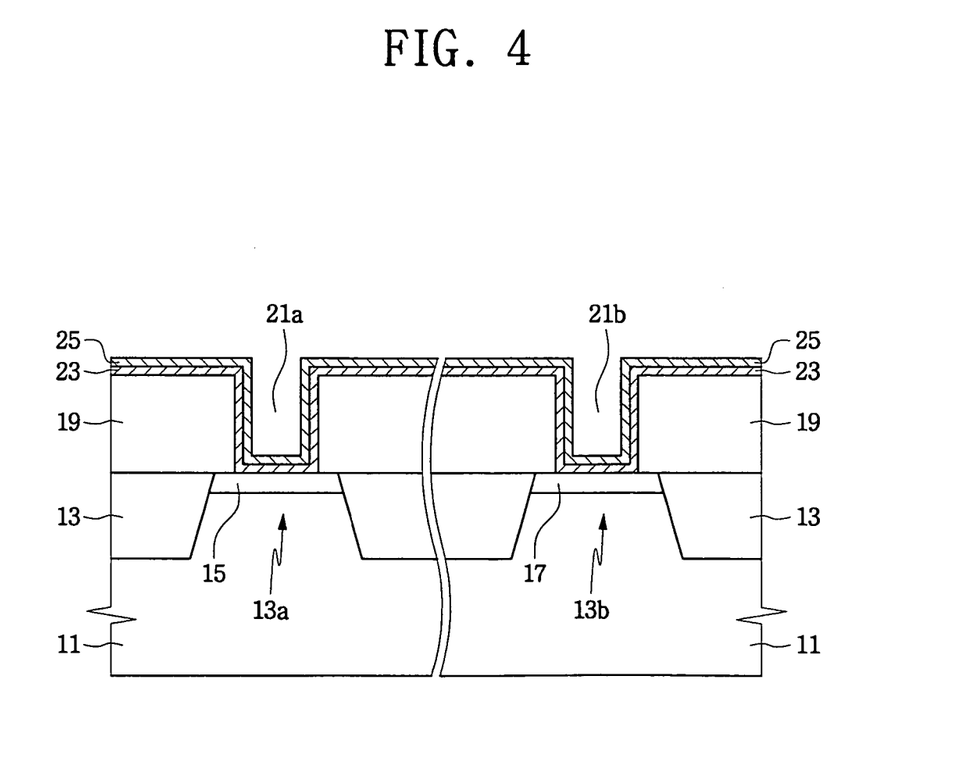

Referring to FIGS. 1A, 2 and 4, the semiconductor substrate having the interlayer insulating layer 19 is temporarily loaded into the first load lock chamber (L1 of FIG. 1A). The semiconductor substrate in the first load lock chamber L1 is transferred onto the cathode plate 51 in the first CVD process chamber P11 using the first robot R1. An ohmic layer 23 is formed on the semiconductor substrate located in the first CVD process chamber P11 using a plasma CVD process (step 1 of FIG. 2). In detail, the ohmic layer 23 is formed by applying an RF power between the cathode plate 51 and the anode plate 53, and injecting source gases into the first CVD process chamber P11 through the source gas injection conduits 55 and 57. If the source gases are a titanium chloride (TiCl4) gas and a hydrogen gas, a plasma CVD titanium layer is formed on the semiconductor substrate. The plasma CVD titanium layer is formed at a temperature of about 400° C. to about 650° C. In the event that the first and second contact holes 21a and 21b expose interconnection lines (not shown) formed of a conductive layer, instead of the impurity regions 15 and 17, the process for forming the ohmic layer 23 can be omitted.

Subsequently, the semiconductor substrate having the ohmic layer 23 is transferred onto the chuck 61 located in the second CVD process chamber P12 using the first robot R1. A barrier metal layer 25 is formed on the semiconductor substrate using a thermal CVD process inside the second CVD process chamber P12 (step 3 of FIG. 2). In detail, the barrier metal layer 25 is formed by heating the semiconductor substrate at a temperature of about 600° C. to about 800° C. using the heater block 63, and injecting source gases into the second CVD process chamber P12 through the source gas injection conduits 65 and 67. In the event that the source gases are a titanium chloride (TiCl4) gas and an ammonia (NH3) gas, a titanium nitride (TiN) layer is formed on the semiconductor substrate.

Alternatively, both of the ohmic layer 23 and the barrier metal layer 25 can be formed using the plasma CVD process or the thermal CVD process.

The semiconductor substrate having the barrier metal layer 25 is transferred into the first cooling chamber C1 using the first robot R1. In the event that the first cooling chamber C1 has the configuration as shown in FIG. 1B, the semiconductor substrate having the barrier metal layer 25 is loaded on the stage 103. The semiconductor substrate on the stage 103 is cooled down to a room temperature by a cooling medium that flows through the circulation conduit 105 (step 5 of FIG. 2). The cooling medium may be de-ionized water or helium gas.

Alternatively, when the second cooling chamber C1 has the configuration as shown in FIG. 1C, the semiconductor substrate having the barrier metal layer 25 is loaded onto the chuck 113. The semiconductor substrate on the chuck 113 is cooled down to a room temperature by a cooling gas introduced into the first cooling chamber C1 through at least one of the first to third cooling gas injection conduits 115, 117 and 119 (step 5 of FIG. 2). The cooling gas may be at least one of an argon gas, a nitrogen gas and a helium gas.

As a result, the cooling time can be reduced without any contamination due to the particles in the atmosphere, since the barrier metal layer 25 is intentionally cooled down using a cooling gas or a cooling medium without breaking vacuum.

Figure 5:
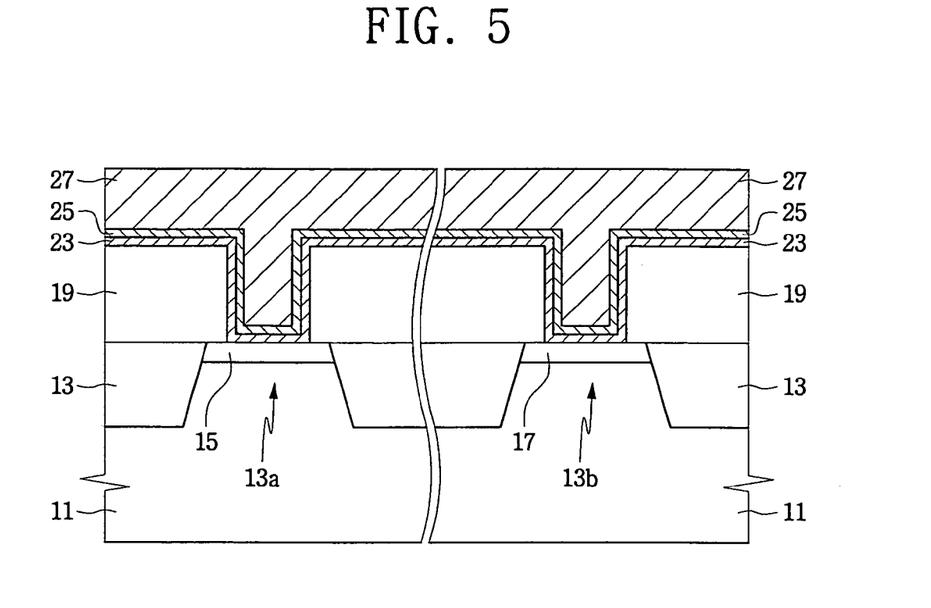

Referring to FIGS. 1A, 2 and 5, the semiconductor substrate having the cooled barrier metal layer is loaded onto the chuck 71 in the fourth CVD process chamber P21 using the second robot R2 in the second transfer chamber T2. The semiconductor substrate on the chuck 71 is heated up to a temperature of from about 300° C. to about 450° C. by the heater block 73, and source gases are injected into the fourth CVD process chamber P21 through the source gas injection conduits 75, 77 and 79. Thus, a metal layer 27 is formed on the cooled semiconductor substrate inside the fourth CVD process chamber P21 (step 7 of FIG. 2). In the event that a tungsten fluoride ($WF_6$) gas, a silane ($SiH_4$) gas and a hydrogen gas are injected through the first to third source gas injection conduits 75, 77 and 79, respectively, the metal layer 27 is a tungsten layer.

As described above, the barrier metal layer 25 is formed inside the second CVD process chamber P12 attached to the first transfer chamber T1, and the metal layer 27 is formed inside the fourth CVD process chamber P21 attached to the second transfer chamber T2, which is separated from the first transfer chamber T1. Therefore, even though the source gases used in formation of the barrier metal layer 25 remain in the first transfer chamber T1, the source gases in the first transfer chamber T1 may not be introduced into the fourth CVD process chamber P21 while the semiconductor substrate having the barrier metal layer 25 is loaded into the fourth CVD process chamber P21 in order to form the metal layer 27. In other words, the tungsten layer do not contain the impurities such as titanium atoms, chlorine atoms and nitrogen atoms decomposed from the TiCl4 gas and the NH3 gas, which are used in formation of the titanium nitride layer 25.

The semiconductor substrate having the metal layer 27 is transferred into the second cooling chamber C2. The semiconductor substrate in the second cooling chamber C2 can be cooled down using the same manner as the cooling process performed inside the first cooling chamber C1. The cooled semiconductor substrate in the second cooling chamber C2 is transferred into the second load lock chamber L2 using the first robot R1, and the semiconductor substrate in the second load lock chamber L2 is unloaded.

Alternatively, the semiconductor substrate in the second cooling chamber C2 can be transferred into the second load lock chamber L2 using the first robot R1 without the application of the cooling process.

Figure 6:
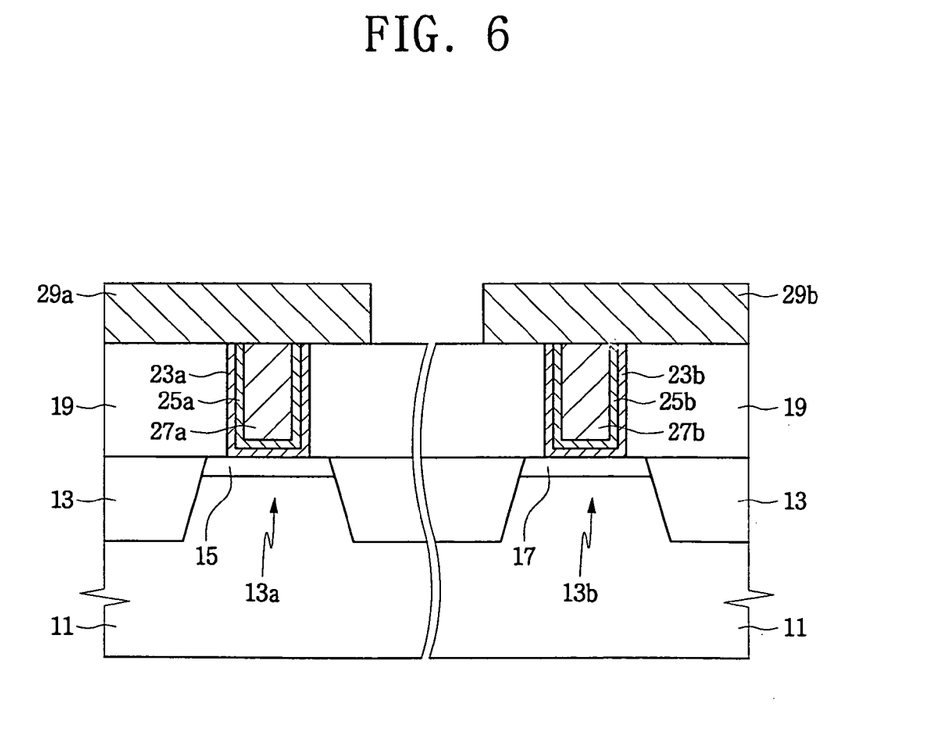

Referring to FIG. 6, the metal layer 27, the barrier metal layer 25 and the ohmic layer 23 may be sequentially planarized until a top surface of the interlayer insulating layer 19 is exposed. As a result, a first ohmic layer pattern 23a, a first barrier metal layer pattern 25a, and a first metal contact plug 27a, are formed inside the first contact hole 21a, and a second ohmic layer pattern 23b, a second barrier metal layer pattern 25b, and a second metal contact plug 27b, are formed inside the second contact hole 21b. A metal interconnection layer such as an aluminum layer is formed on the semiconductor substrate having the metal contact plugs 27a and 27b. The metal interconnection layer is patterned to form a first metal line 29a covering the first metal contact plug 27a and a second metal line 29b covering the second metal contact plug 27b.

Figure 7A:
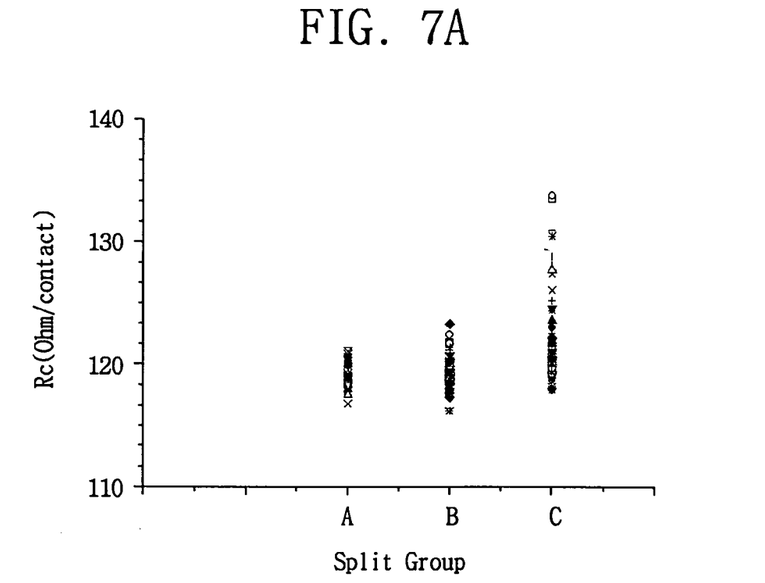
FIG. 7A is a graph to illustrate a contact resistance characteristic of N-type impurity regions of contact structures fabricated using a conventional method of forming a metal layer and a contact resistance characteristic of N-type impurity regions of contact structures fabricated using a method of forming a metal layer according to one embodiment of the present invention.
Figure 7B:
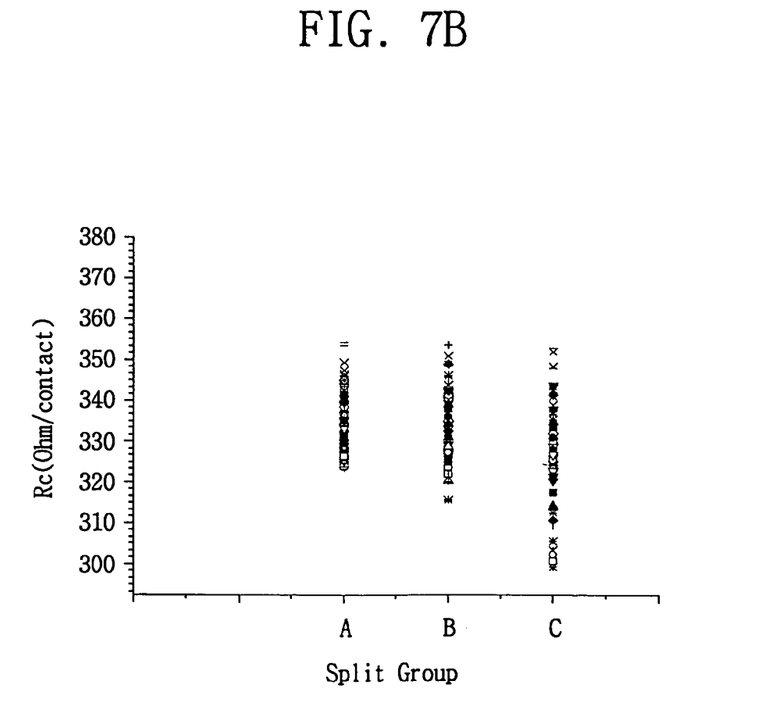
FIG. 7B is a graph to illustrate a contact resistance characteristic of P-type impurity regions of contact structures fabricated using a conventional method of forming a metal layer and a contact resistance characteristic of P-type impurity regions of contact structures fabricated using a method of forming a metal layer according to one embodiment of the present invention.

In FIGS. 7A and 7B, the abscissas represent split groups, and the ordinates represent contact resistance. In detail, group "A" denotes the contact resistance of the conventional contact structures fabricated using breaking vacuum, and group "C" denotes the contact resistance of the conventional contact structures fabricated using an in-situ metallization process without application of the cooling process. Also, group "B" denotes the contact resistance of the contact structures fabricated according to the embodiment of the present invention. All of the structures indicated by groups "A", "B" and "C" were fabricated to have impurity regions formed at a semiconductor substrate, an interlayer insulating layer formed on the semiconductor substrate having the impurity regions, contact holes penetrating predetermined regions of the interlayer insulating layer to expose the impurity regions, metal plugs filling the contact holes, and a titanium layer and a titanium nitride layer interposed between the metal plugs and the impurity regions. Both the N-type contact size and the P-type contact size were 0.29 mm×0.29 mm on a photo mask.

The contact structures showing the measurement results of FIGS. 7A and 7B were fabricated using the main process conditions described in the following Table 1.

TABLE 1

| Process Parameter | | process condition | | |
|---|---|---|---|---|
| | | group "A" | group "B" | group "C" |
| N-type impurity ion implantation | | | As, $5 \times 10^{15}$ atoms/cm$^2$ | |
| P-type impurity ion implantation | | | BF$_2$, $1 \times 10^{15}$ atoms/cm$^2$ | |
| annealing | | | 700° C., nitrogen atmosphere, RTP | |
| ohmic layer (plasma CVD Ti layer) | thickness | | 100 angstroms | |
| | deposition temperature | | 650° C. | |
| | source gases | | TiCl$_4$ + H$_2$ | |
| | process pressure | | 5 Torr | |
| barrier layer (thermal CVD TiN layer) | Thickness | | 200 angstroms | |
| | deposition temperature | | 700° C. | |
| | source gases | | TiCl$_4$ + NH$_3$ | |
| | process pressure | | 5 Torr | |
| | cooling process | vacuum break (cooling in the atmosphere) | in-situ cooling (nitrogen, room temperature) | skipped |
| metal plug (thermal CVD tungsten plug) | deposition temperature | | 400° C. | |
| | source gases | | WF$_6$ + H$_2$ + SiH$_4$ | |
| | process pressure | | 90 Torr | |

In Table 1, samples of group "A" were naturally cooled down in the atmosphere after formation of the thermal CVD TiN layer, and samples of group "B" were cooled down using a nitrogen gas inside an in-situ cooling chamber after formation of the thermal CVD TiN layer. That is, the samples of group "B" were fabricated using the CVD apparatus shown in FIG. 1A. In contrast, no cooling process was applied to samples of group "C". That is, a tungsten layer was directly formed on the thermal CVD TiN layer using an in-situ process.

As can be seen from FIGS. 7A and 7B, the contact resistance values of the samples formed according to the present invention (group "B") were similar to those of the samples formed using the prior art (group "A") employing the natural cooling process. In contrast, the contact resistance values of the conventional samples (group "C") formed without any cooling process were relatively non-uniform as compared to those of the samples according to the present invention. Particularly, in the contact resistance values of the N-type impurity regions shown in FIG. 7A, the samples of group "C" exhibited higher contact resistance values than the samples according to the present invention.

It can be understood that this is because the temperature of the semiconductor substrate having the TiN layer is higher than the deposition temperature of the tungsten layer.

As described above, according to an aspect of the present invention, the semiconductor substrate having the barrier metal layer is cooled using the in-situ cooling chamber, and the metal layer is formed on the cooled semiconductor substrate. Therefore, the effect that the temperature of the barrier metal layer which influences the contact resistance can be significantly reduced. As a result, the present invention allows the formation of the reliable contact structure without any degradation of the throughput.

Although the preferred embodiments of the present invention have been described in detail hereinabove, it should be understood that many variations and/or modifications of the basic inventive concepts apparent to those skilled in the art will still fall within the spirit and scope of the present invention as defined in the appended claims.

What is claimed is:

1. A CVD metallization process, comprising:
    loading a semiconductor substrate into a first transfer chamber;
    transferring the semiconductor substrate in the first transfer chamber into a first CVD process chamber attached to the first transfer chamber;
    forming a first metal layer comprising a barrier metal layer on the semiconductor substrate in the first CVD process chamber;
    transferring the semiconductor substrate having the first metal layer into a second transfer chamber separated from the first transfer chamber without breaking vacuum;
    transferring the semiconductor substrate in the second transfer chamber into a second CVD process chamber attached to the second transfer chamber;
    forming a second metal layer on the semiconductor substrate inside the second CVD process chamber;

forming an impurity region in a portion of the semiconductor substrate before loading the semiconductor substrate into the first transfer chamber;

forming an interlayer insulating layer on the semiconductor substrate having the impurity region, the interlayer insulating layer having a contact hole that exposes the impurity region; and forming a conformal ohmic layer comprising a titanium layer in the contact hole and on the interlayer insulating layer.

2. The CVD metallization process according to claim 1, wherein the barrier metal layer comprises a titanium nitride layer.

3. The CVD metallization process according to claim 1, wherein the second metal layer comprises a tungsten layer.

4. The CVD metallization process according to claim 3, further comprising:

planarizing the tungsten layer, the barrier metal layer and the ohmic layer until a top surface of the interlayer insulating layer is exposed, thereby forming an ohmic layer pattern and a barrier metal layer pattern that sequentially cover an inner wall of the contact hole as well as a tungsten plug surrounded by the barrier metal layer pattern, after formation of the tungsten layer; and forming a metal line that covers the tungsten plug.

5. A CVD metallization process, comprising:

loading a semiconductor substrate into a first transfer chamber of a CVD apparatus;

transferring the semiconductor substrate in the first transfer chamber into a first CVD process chamber attached to the first transfer chamber;

forming a barrier metal layer on the semiconductor substrate at a first temperature inside the first CVD process chamber;

transferring the semiconductor substrate having the barrier metal layer into the cooling chamber through the first transfer chamber without breaking vacuum;

cooling the semiconductor substrate inside a cooling chamber from a first temperature to a second temperature which is lower than the first temperature;

transferring the cooled semiconductor substrate into a second transfer chamber separated from the first transfer chamber without breaking vacuum, wherein the first and second transfer chambers are separated from each other by the cooling chamber;

transferring the semiconductor substrate in the second transfer chamber into a second CVD process chamber attached to the second transfer chamber; and forming an additional metal layer on the semiconductor substrate inside the second CVD process chamber.

6. The CVD metallization process according to claim 5, further comprising:

forming an impurity region in a portion of the semiconductor substrate before loading the substrate into the first transfer chamber; and forming an interlayer insulating layer on the semiconductor substrate having the impurity region, the interlayer insulating layer having a contact hole that exposes the impurity region.

7. The CVD metallization process according to claim 6, further comprising:

transferring the semiconductor substrate in the first transfer chamber into a third CVD process chamber attached to the first transfer chamber, before transferring the semiconductor substrate having the contact hole into the first CVD process chamber; and forming an ohmic layer on the semiconductor substrate inside the third CVD process chamber.

8. The CVD metallization process according to claim 7, wherein the ohmic layer comprises a titanium layer.

9. The CVD metallization process according to claim 7, further comprising:

unloading the semiconductor substrate having the metal layer from the CVD apparatus;

planarizing the additional metal layer, the barrier metal layer and the ohmic layer until a top surface of the interlayer insulating layer is exposed, thereby forming an ohmic layer pattern, a barrier metal layer pattern and a metal contact plug in the contact hole; and forming a metal line that covers the metal contact plug.

10. The CVD metallization process according to claim 5, wherein the barrier metal layer comprises a titanium nitride layer.

11. The CVD metallization process according to claim 5, wherein cooling the semiconductor substrate inside the cooling chamber comprises injecting a cooling gas into the cooling chamber.

12. The CVD metallization process according to claim 11, wherein the cooling gas includes at least one of an argon gas, a nitrogen gas and a helium gas.

13. The CVD metallization process according to claim 5, wherein the second temperature is approximately room temperature.

14. The CVD metallization process according to claim 5, wherein the additional metal layer comprises a tungsten layer.

15. The CVD metallization process according to claim 14, wherein the tungsten layer is formed at a third temperature between the first and second temperatures using a thermal CVD process.

16. A chemical vapor deposition (CVD) metallization process using a CVD apparatus, the process comprising:

forming a barrier metal layer on a semiconductor substrate;

cooling the semiconductor substrate having the barrier metal layer without breaking vacuum; and forming an additional metal layer on the cooled barrier metal layer;

forming an impurity region in a portion of the semiconductor substrate prior to formation of the barrier metal layer;

forming an interlayer insulating layer on the semiconductor substrate having the impurity region, the interlayer insulating layer having a contact hole that exposes the impurity region; and forming an ohmic layer which comprises a titanium layer in the contact hole and on the interlayer insulating layer.

17. The CVD metallization process according to claim 16, wherein the barrier metal layer comprises a titanium nitride layer.

18. The CVD metallization process according to claim 16, wherein the barrier metal layer is formed at a temperature of from about 600° C. to about 800° C. using a thermal CVD process.

19. The CYD metallization process according to claim 16, wherein the cooling process is performed using a cooling medium.

20. The CVD metallization process according to claim 19, wherein the cooling medium includes at least one of an argon gas, a nitrogen gas, a helium gas and de-ionized water.

21. The CVD metallization process according to claim 16, wherein the additional metal layer is formed after the cooling process without breaking vacuum.

22. The CVD metallization process according to claim 16, wherein the additional metal layer comprises a tungsten layer.

23. The CVD metallization process according to claim 16, wherein the additional metal layer is formed at a temperature of from about 300° C. to about 450° C. using a thermal CVD process.

24. The CVD metallization process according to claim 16, further comprising:
planarizing the additional metal layer, the barrier metal layer and the ohmic layer until a top surface of the interlayer insulating layer is exposed, thereby forming an ohmic layer pattern and a barrier metal layer pattern that sequentially cover an inner wall of the contact hole as well as a metal contact plug surrounded by the barrier metal layer pattern; and
forming a metal line that covers the metal contact plug.

25. A chemical vapor deposition (CVD) metallization process using a CVD apparatus, the process comprising:
forming a barrier metal layer on a semiconductor substrate;
cooling the semiconductor substrate having the barrier metal layer without breaking vacuum;
forming an additional metal layer on the cooled barrier metal layer;
forming an impurity region in a portion of the semiconductor substrate prior to formation of the barrier metal layer;
forming an interlayer insulating layer on the semiconductor substrate having the impurity region, the interlayer insulating layer having a contact hole that exposes the impurity region;
forming an ohmic layer in the contact hole and on the interlayer insulating layer;
planarizing the additional metal layer, the barrier metal layer and the ohmic layer until a top surface of the interlayer insulating layer is exposed, thereby forming an ohmic layer pattern and a barrier metal layer pattern that sequentially cover an inner wall of the contact hole as well as a metal contact plug surrounded by the barrier metal layer pattern; and
forming a metal line that covers the metal contact plug.

26. A CVD metallization process, comprising:
loading a semiconductor substrate into a first transfer chamber;
transferring the semiconductor substrate in the first transfer chamber into a first CVD process chamber attached to the first transfer chamber;
forming a first metal layer comprising a barrier metal layer on the semiconductor substrate in the first CVD process chamber;
transferring the semiconductor substrate having the first metal layer into a second transfer chamber separated from the first transfer chamber without breaking vacuum;
transferring the semiconductor substrate in the second transfer chamber into a second CVD process chamber attached to the second transfer chamber;
forming a second metal layer comprising a tungsten layer on the semiconductor substrate inside the second CVD process chamber;
forming an impurity region in a portion of the semiconductor substrate before loading the semiconductor substrate into the first transfer chamber;
forming an interlayer insulating layer on the semiconductor substrate having the impurity region, the interlayer insulating layer having a contact hole that exposes the impurity region; and
forming a conformal ohmic layer in the contact hole and on the interlayer insulating layer.

27. The CVD metallization process according to claim 26, further comprising:
planarizing the tungsten layer, the barrier metal layer and the ohmic layer until a top surface of the interlayer insulating layer is exposed, thereby forming an ohmic layer pattern and a barrier metal layer pattern that sequentially cover an inner wall of the contact hole as well as a tungsten plug surrounded by the barrier metal layer pattern, after formation of the tungsten layer; and
forming a metal line that covers the tungsten plug.

28. A CVD metallization process, comprising:
loading a semiconductor substrate into a first transfer chamber of a CVD apparatus;
transferring the semiconductor substrate in the first transfer chamber into a first CVD process chamber attached to the first transfer chamber;
forming a barrier metal layer on the semiconductor substrate at a first temperature inside the first CVD process chamber;
transferring the semiconductor substrate having the barrier metal layer into the cooling chamber through the first transfer chamber without breaking vacuum;
cooling the semiconductor substrate inside a cooling chamber from a first temperature to a second temperature which is lower than the first temperature;
transferring the cooled semiconductor substrate into a second transfer chamber separated from the first transfer chamber without breaking vacuum, wherein the first and second transfer chambers are separated from each other by the cooling chamber;
transferring the semiconductor substrate in the second transfer chamber into a second CVD process chamber attached to the second transfer chamber;
forming an additional metal layer on the semiconductor substrate inside the second CVD process chamber;
forming an impurity region in a portion of the semiconductor substrate before loading the substrate into the first transfer chamber;
forming an interlayer insulating layer on the semiconductor substrate having the impurity region, the interlayer insulating layer having a contact hole that exposes the impurity region;
transferring the semiconductor substrate in the first transfer chamber into a third CVD process chamber attached to the first transfer chamber, before transferring the semiconductor substrate having the contact hole into the first CVD process chamber; and
forming an ohmic layer on the semiconductor substrate inside the third CVD process chamber.

29. The CVD metallization process according to claim 28, wherein the ohmic layer comprises a titanium layer.

30. The CVD metallization process according to claim 28, further comprising:
unloading the semiconductor substrate having the metal layer from the CVD apparatus;
planarizing the additional metal layer, the barrier metal layer and the ohmic layer until a top surface of the interlayer insulating layer is exposed, thereby forming an ohmic layer pattern, a barrier metal layer pattern and a metal contact plug in the contact hole; and
forming a metal line that covers the metal contact plug.

31. A CVD metallization process, comprising:
loading a semiconductor substrate into a first transfer chamber of a CVD apparatus;
transferring the semiconductor substrate in the first transfer chamber into a first CVD process chamber attached to the first transfer chamber;
forming a barrier metal layer on the semiconductor substrate at a first temperature inside the first CVD process chamber;
transferring the semiconductor substrate having the barrier metal layer into the cooling chamber through the first transfer chamber without breaking vacuum;
cooling the semiconductor substrate inside a cooling chamber from a first temperature to a second temperature which is lower than the first temperature comprising injecting a cooling gas into the cooling chamber;
transferring the cooled semiconductor substrate into a second transfer chamber separated from the first transfer chamber without breaking vacuum;
transferring the semiconductor substrate in the second transfer chamber into a second CVD process chamber attached to the second transfer chamber; and
forming an additional metal layer on the semiconductor substrate inside the second CVD process chamber.

32. The CVD metallization process according to claim 31, wherein the cooling gas includes at least one of an argon gas, a nitrogen gas and a helium gas.

33. A CVD metallization process, comprising:
loading a semiconductor substrate into a first transfer chamber of a CVD apparatus;
transferring the semiconductor substrate in the first transfer chamber into a first CVD process chamber attached to the first transfer chamber;
forming a barrier metal layer on the semiconductor substrate at a first temperature inside the first CVD process chamber;
transferring the semiconductor substrate having the barrier metal layer into the cooling chamber through the first transfer chamber without breaking vacuum;
cooling the semiconductor substrate inside a cooling chamber from a first temperature to a second temperature which is lower than the first temperature;
transferring the cooled semiconductor substrate into a second transfer chamber separated from the first transfer chamber without breaking vacuum;
transferring the semiconductor substrate in the second transfer chamber into a second CVD process chamber attached to the second transfer chamber; and
forming an additional metal layer comprising a tungsten layer on the semiconductor substrate inside the second CVD process chamber.

34. The CVD metallization process according to claim 33, wherein the tungsten layer is formed at a third temperature between the first and second temperatures using a thermal CVD process.

* * * * *

UNITED STATES PATENT AND TRADEMARK OFFICE
CERTIFICATE OF CORRECTION

| | | |
|---|---|---|
| PATENT NO. | : 7,183,207 B2 | Page 1 of 1 |
| APPLICATION NO. | : 10/855114 | |
| DATED | : February 27, 2007 | |
| INVENTOR(S) | : Doo-Won Kang et al. | |

It is certified that error appears in the above-identified patent and that said Letters Patent is hereby corrected as shown below:

Column 10, line 61, the word "CYD" should read -- CVD --.

Signed and Sealed this

Fifth Day of August, 2008

JON W. DUDAS
*Director of the United States Patent and Trademark Office*